United States Patent
Porter et al.

(10) Patent No.: US 7,948,793 B2
(45) Date of Patent: May 24, 2011

(54) TEMPERATURE COMPENSATION IN MEMORY DEVICES AND SYSTEMS

(75) Inventors: John David Porter, Meridian, ID (US); Jennifer E. Taylor, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 270 days.

(21) Appl. No.: 12/209,947

(22) Filed: Sep. 12, 2008

(65) Prior Publication Data
US 2010/0067287 A1 Mar. 18, 2010

(51) Int. Cl.
*G11C 11/00* (2006.01)
(52) U.S. Cl. ...... 365/163; 365/148; 365/211; 365/225.7
(58) Field of Classification Search .................. 365/163, 365/211, 148, 225.7
See application file for complete search history.

(56) References Cited

U.S. PATENT DOCUMENTS

| | | | |
|---|---|---|---|
| 7,405,965 B2 | 7/2008 | Choi et al. | |
| 7,548,451 B2 * | 6/2009 | Oh et al. | 365/163 |
| 7,596,037 B2 * | 9/2009 | Sarin et al. | 365/189.09 |
| 7,675,792 B2 * | 3/2010 | Bedeschi et al. | 365/189.09 |
| 2007/0070769 A1 * | 3/2007 | Braceras et al. | 365/226 |
| 2008/0055972 A1 | 3/2008 | Oh et al. | |

OTHER PUBLICATIONS

Miao, X. S., et al. "Temperature Dependence of Phase-Change Random Access Memory Cell," Jpn. J. App. Phys., pp. 3955-3958, vol. 45, No. 5A. (2006).

\* cited by examiner

*Primary Examiner* — Pho M Luu
(74) *Attorney, Agent, or Firm* — Brooks, Cameron & Huebsch, PLLC (57) ABSTRACT

Devices, methods, and systems for temperature compensation in memory devices, such as resistance variable memory, among other types of memory are included. A memory device can include a table with an output that is used to create a multiplication factor for a current to compensate for temperature changes in the memory device, where the output depends on an operating temperature of the memory device and a difference in the current between a highest specified operating temperature and a lowest specified operating temperature of the memory device.

29 Claims, 7 Drawing Sheets

TEMPERATURE COMPENSATION IN MEMORY DEVICES AND SYSTEMS

TECHNICAL FIELD

The present disclosure relates generally to semiconductor memory devices, methods, and systems, and more particularly, to devices, methods, and systems for temperature compensation in semiconductor memory.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), flash memory, and resistance variable memory, among others.

Memory may be volatile or non-volatile. Volatile memory requires power to maintain the information stored therein, e.g., when power to volatile memory is lost, the information stored therein is also lost. Non-volatile memory, in contrast, does not lose the information stored therein in the absence of power, e.g., non-volatile memory can retain the information stored therein even if no power is being provided to the memory. Types of volatile memory include RAM, DRAM, and SDRAM, among others. Types of non-volatile memory include ROM, flash memory, and resistance variable memory, among others.

Types of resistance variable memory include programmable conductor memory, phase change random access memory (PCRAM), and resistive random access memory (RRAM), among others. A physical layout of a PCRAM memory device may resemble that of a DRAM device, with the capacitor of the DRAM cell being replaced by a phase change material, such as Germanium-Antimony-Telluride (GST). A physical layout of an RRAM memory device may include memory cells including a variable resistor thin film, e.g., a colossal magnetoresistive material, which can be connected to an access device, such as a diode, a field effect transistor (FET), or a bipolar junction transistor (BJT), for example.

The memory cell material of a PCRAM device, e.g., GST, for a single-level cell (SLC), may exist in an amorphous, higher resistance state, or a crystalline, lower resistance state. The resistance state of the PCRAM cell may be altered by applying sources of energy to the cell, such as current pulses or pulses of light, among other sources of energy. For example, the resistance state of the PCRAM cell may be altered by heating the cell with a programming current. This results in the PCRAM cell being programmed to a particular resistance state. In a binary system, for example, the amorphous, high resistance state may correspond to a logic state of 1, and the crystalline, low resistance state may correspond to a logic state of 0. However, the choice of these corresponding logic states may be reversed, that is, in other binary systems, the amorphous, high resistance state may correspond to a logic state of 0, and the crystalline, low resistance state may correspond to a logic state of 1. The resistance state of an RRAM cell, e.g., the variable resistor thin film, may be increased and/or decreased by applying positive and/or negative electrical pulses across the film. This may result in the RRAM cell being programmed to a particular resistance state.

An SLC may represent two programmed states as represented by the binary digits 1 or 0. Memory cells may also be programmed to more than two states, such as to a number of states that allows a cell to represent more than two binary digits, e.g., 1111, 0111, 0011, 1011, 1001, 0001, 0101, 1101, 1100, 0100, 0000, 1000, 1010, 0010, 0110, and 1110. Such cells may be referred to as multi state memory cells, multibit cells, or multilevel cells (MLCs). The memory cell material of a PCRAM device including MLCs may exist in a number of intermediate states between what are generally considered to be amorphous and crystalline. MLCs may allow the manufacture of higher density memories without increasing the number of memory cells since each cell can represent more than one digit, e.g., more than one bit.

DETAILED DESCRIPTION OF THE DISCLOSURE

Devices, methods, and systems for temperature compensation in memory devices, such as resistance variable memory, among other types of memory, have been described herein. One or more embodiments can include a memory device including a table with an output that is used to create a multiplication factor for a current to compensate for temperature changes in the memory device, where the output depends on an operating temperature of the memory device and a difference in the current between a highest specified operating temperature and a lowest specified operating temperature of the memory device.

In the following detailed description of the present disclosure, reference is made to the accompanying drawings that form a part hereof, and in which is shown by way of illustration how one or more embodiments of the disclosure may be practiced. These one or more embodiments are described in sufficient detail to enable those of ordinary skill in the art to practice the one or more embodiments of this disclosure, and it is to be understood that other embodiments may be utilized and that process, electrical, or mechanical changes my be made without departing from the scope of the present disclosure.

Figure 1:
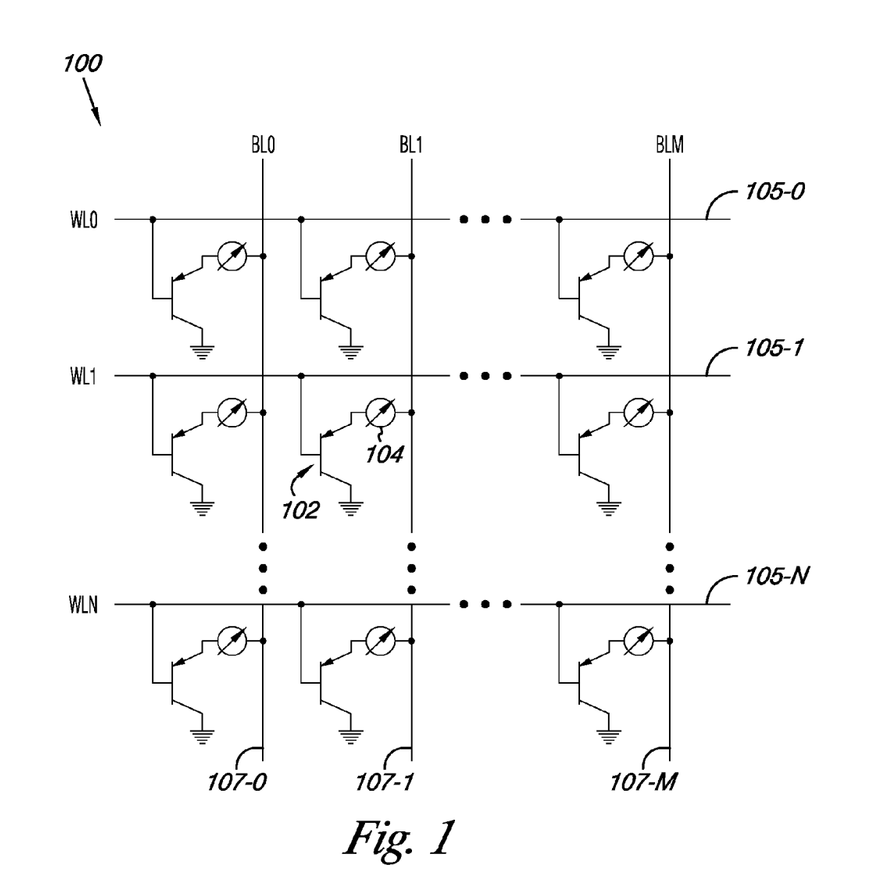
FIG. 1 is a schematic of a portion of a resistance variable memory array that can be used with one or more embodiments of the present disclosure.

FIG. 1 is a schematic of a portion of a resistance variable memory array 100 that can be used with one or more embodiments of the present disclosure. In the embodiment illustrated in FIG. 1, the memory array 100 includes a number of phase change memory cells each having an associated access device 102 and resistance variable element 104, e.g., a phase change material 104. The access devices 102 can be operated, e.g., turned on/off, to access the memory cells in order to perform operations such as programming and/or sensing, e.g., reading, operations on the resistance variable elements 104. In the embodiment illustrated in FIG. 1, the access devices 102 are PNP bipolar junction transistors (BJTs). Alternatively, access devices 102 can be NPN BJTs, diodes, and/or metal-oxide-semiconductor field-effect-transistors (MOSFETs), among other types of access devices, as will be appreciated by one of ordinary skill in the art.

As shown in FIG. 1, a base region of each BJT 102 associated with each memory cell is coupled to one of a number of access lines, such as word lines 105-0 (WL0), 105-1 (WL1), . . . , 105-N (WLN), e.g., each word line 105-0, 105-1, . . . , 105-N is coupled to a "row" of phase change memory cells. The designator "N" is used to indicate that a memory array can include a number of word lines. The use of the term "row" is not meant to imply a particular linear and/or horizontal orientation of the memory cells. Rather, a row can mean a number of memory cells coupled to a particular word line, regardless of the orientation of the memory cells. For example, a row can include a number of memory cells coupled to a particular word line in a staggered, non-linear orientation.

In one or more embodiments, the resistance variable elements 104 can be a phase change chalcogenide alloy such as a Germanium-Antimony-Tellurium (GST) material, e.g., a Ge—Sb—Te material such as $Ge_2Sb_2Te_5$, $Ge_1Sb_2Te_4$, $Ge_1Sb_4Te_7$, etc. The hyphenated chemical composition notation, as used herein, indicates the elements included in a particular mixture or compound, and is intended to represent all stoichiometries involving the indicated elements. Other phase change materials can include GeTe, In—Se, $Sb_2Te_3$, GaSb, InSb, As—Te, Al—Te, SbSe, Ge—Sb—Te, Ge—Sb—Se, Te—Ge—As, In—Sb—Te, Te—Sn—Se, Ge—Se—Ga, Bi—Se—Sb, Ga—Se—Te, Sn—Sb—Te, In—Sb—Ge, In—Sb—Se, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, Ge—Te—Sn—Pt, and Ag—In—Sb—Se—Te, among various other phase change materials. However, embodiments of the present disclosure are not so limited, and can include impurities and/or the addition of other elements as well.

In the embodiment illustrated in FIG. 1, each resistance variable element 104 is coupled to one of a number of data lines, such as bit lines 107-0 (BL0), 107-1 (BL1), . . . , 107-M (BLM), i.e., each bit line 107-0, 107-1, . . . , 107-M is coupled to a "column" of phase change memory cells. The designator "M" is used to indicate that a memory array can include a number of bit lines. For ease of addressing in the digital environment, the number of word lines 105-1, . . . , 105-N and the number of bit lines 107-1, . . . , 107-M can each be some power of two, e.g., 256 word lines by 4,096 bit lines. However, embodiments are not limited to particular numbers of word lines and/or bit lines. Further, the use of the term "column" is not meant to imply a particular linear and/or vertical orientation of the memory cells. Rather, a column can mean a number of memory cells coupled to a particular bit line, regardless of the orientation of the memory cells. For example, a column can include a number of memory cells coupled to a particular bit line in a staggered, e.g., non-linear, fashion.

In operation, appropriate voltage and/or current signals, e.g., pulses, can be applied to the bit lines 107-0, 107-1, . . . , 107-M and word lines 105-0, 105-1, . . . , 105-N in order to program data to and/or read, e.g., sense, data from the phase change memory cells of the array 100. Sensing operations in accordance with the present disclosure will be further described herein.

Embodiments of the present disclosure are not limited to the example array 100 illustrated in FIG. 1. A memory array can have an architecture other than that illustrated in FIG. 1, as will be understood by one of ordinary skill in the art. Further, as one of ordinary skill in the art will appreciate, the phase change memory array 100 can be coupled to programming circuitry and/or sensing circuitry (not shown in FIG. 1). Sensing circuitry in accordance with the present disclosure will be further described herein.

The number of phase change memory cells shown in memory array 100 can be single level cells (SLCs) and/or multilevel cells (MLCs). A single level phase change memory cell can be programmed to a generally more amorphous (reset) state or a generally more crystalline (set) state. Such reset and/or set states may correspond to a binary 0 and/or 1. A reset pulse can include a relatively high current pulse applied to the cell for a relatively short period of time. The current applied to the cell can be quickly reduced after the phase change material "melts," allowing the cell to cool quickly into a more amorphous state where atomic motion that can allow crystallization generally occurs to a lesser degree due, at least in part due to relatively rapid cooling of the material. Conversely, a set pulse can include a relatively lower current pulse applied to the cell for a relatively longer period of time with a slower quenching speed, e.g., the current may be more slowly reduced allowing the phase change material greater time to cool. Accordingly, the material may crystallize to a greater degree than after the reset pulse. Some phase change materials can have a greater resistivity associated with a more amorphous state and a lesser resistivity associated with a more crystalline state.

Multilevel phase change memory cells can be programmed to one or more intermediate states between amorphous and crystalline. For example, multilevel phase change memory cells can be programmed to various levels of structural order. Through application of one or more programming pulses at particular current levels, the cells can be programmed to a given resistance state. With appropriate programming currents, the cells can be programmed to one or more intermediate states having a partial amorphous and a partial crystalline structure, providing for multilevel resistance states. The number of programming states chosen for a particular cell can be based on, for example, the desired application, design and process limits, e.g., programming time, sensing time, and accuracy of sensing circuitry, and other factors.

Figure 2:
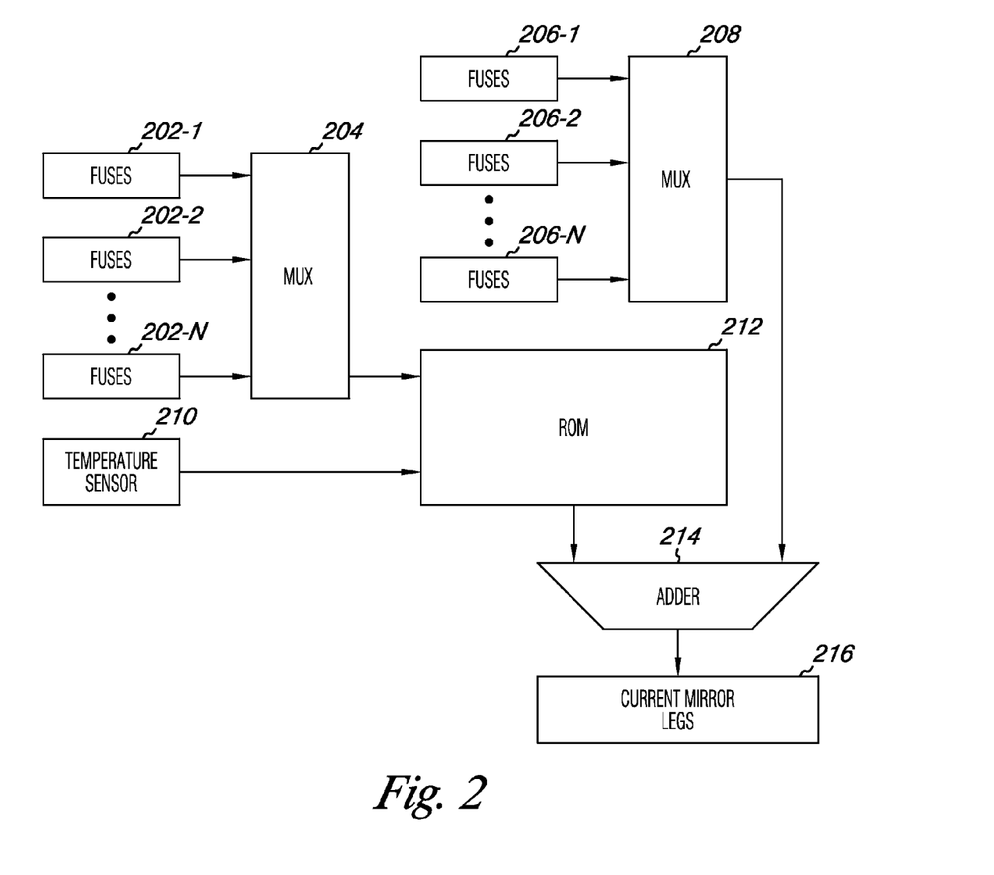
FIG. 2 is a block diagram of circuitry for producing currents in a multilevel phase change memory device in accordance with one or more embodiments of the present disclosure.

FIG. 2 is a block diagram of circuitry for producing currents in a multilevel phase change memory device in accordance with one or more embodiments of the present disclosure.

In one or more embodiments, a memory device can include a number of groups of sets of fuses. As used herein, "fuses" can include fuses and/or antifuses, among other types of conductive path controlling devices. In one or more embodiments, a memory device can include a first group of sets of fuses, e.g., sets 206-1, 206-2, . . . 206-N. A set of fuses, e.g., set 206-1 can include a number of fuses. Each set of fuses in the first group can be programmed to represent a magnitude of a corresponding reference current at a certain operating temperature, such as a specified lowest or highest operating temperature of the memory device, among other temperatures. Accordingly, different sets of fuses, e.g., sets 206-1 and 206-2, can be programmed to represent different magnitudes of different reference currents at either the specified lowest operating temperature of the memory device or the specified highest operating temperature. That is, different sets of fuses can correspond to different reference currents.

The first group of sets of fuses can be coupled to a multiplexor 208. The multiplexor 208 can select the particular set of fuses that corresponds to a particular one of the reference currents and output a signal(s) corresponding to the particular set of programmed fuses to an adder or subtractor 214 (depending on whether the selected fuses are programmed to correspond to the magnitude of the selected reference current at the lowest or highest specified operating temperature, respectively). Operation of an embodiment where the selected fuses are programmed to correspond to the magnitude of the selected reference current at the lowest specified operating temperature and wherein 214 is an adder 214 will be described in more detail below.

In one or more embodiments, the memory device can include a second group of sets of fuses, e.g., sets 202-1, 202-2, . . . 202-N. Each set of fuses in the second group can store data corresponding to a difference in magnitude of a corresponding reference current between a highest specified operating temperature and a lowest specified operating temperature of the memory device.

The second group of sets of fuses can be coupled to a multiplexor 204. The multiplexor 204 can select the particular set of fuses that corresponds to a particular reference current and output a signal(s) corresponding to the particular set of fuses to a look-up table stored in memory, such as read only memory (ROM) 212. Operation of the ROM 212 is described in more detail below.

As used herein, a "highest" and "lowest" operating temperature of a memory device can be specified by, for example, the manufacturer of the memory device. For example, a manufacturer could specify that the memory device is designed to operate between −40 degrees Celsius and 120 degrees Celsius, e.g., to correspond to a product specification. The magnitudes of different reference currents at the specified highest and lowest temperatures for the memory device can be determined experimentally for a particular device, among other means.

Such magnitudes can be coded and programmed into fuses. That is, a particular set of fuses can be programmed to represent the endpoints of a plot of a particular determined temperature compensated reference current versus operating temperature. For certain memory devices, it may be appropriate to use fuses that are substantially similar to the memory cells of the device. However, for memory devices that may include temperature sensitive memory cells, such as PCRAM devices, it may be appropriate to utilize fuses other than the type of memory cells in the device. For embodiments including PCRAM memory cells, it may be beneficial to use laser, gate oxide, or other fuse types to help provide a greater degree of temperature immunity to the fuses so that, for example, the data stored in the fuses is less likely to be corrupted when the memory device is soldered.

In one or more embodiments, the memory device can include a temperature sensor 210. The temperature sensor 210 can send an output signal(s) to the ROM 212 that corresponds to the operating temperature of the memory device.

In one or more embodiments, the look-up table, e.g., ROM table 212, can include data corresponding to desired changes in various reference currents at various operating temperatures. Accordingly, the data stored in the ROM 212 can correspond to a plot of one or more reference currents versus temperature over the specified operating range of the memory device.

As described herein, the magnitude of the reference current at the highest and lowest operating temperatures, e.g., the endpoints of a plot of the reference current versus operating temperature, can be determined experimentally. The magnitude of the reference current at temperatures between the highest and lowest operating temperatures can be interpolated based on a function. Values corresponding to that function, valid across a number of reference currents that correspond to that function, can be stored in the ROM 212.

For example, a reference current may change linearly with respect to operating temperature. Accordingly, the interpolated value of a reference current for a particular temperature can be equal to A, the difference in current magnitudes at the highest and lowest operating temperatures (e.g., the output of multiplexor 204), divided by B, the difference between the highest and lowest operating temperatures, multiplied by C, the particular temperature (e.g., the output of temperature sensor 210), plus the magnitude of the current at the lowest operating temperature (e.g., the output of multiplexor 208). Data corresponding to such a function can be stored in the ROM 212.

As the reader will appreciate, not all reference currents will change linearly with respect to operating temperature. Accordingly, embodiments of the present disclosure can be modified by one of ordinary skill in the art to populate a ROM with appropriate data for the behavior of a given reference current. For example, some reference currents may change logarithmically with respect to operating temperature. As the reader will also appreciate, for embodiments including PCRAM memory cells, it may be desirable for the reference current to change proportionally to a change in resistivity of a PCRAM memory cell with operating temperature. An example of proportionally changing a reference current in relation to a change in resistivity of a PCRAM memory cell is provided in copending, commonly assigned U.S. patent application Ser. No. 12/209,923, entitled "Memory Sensing Devices, Methods, and Systems" by inventor Jennifer Taylor, et al., filed on the same day herewith (hereinafter, "Taylor"), and is also discussed herein.

In one or more embodiments, the ROM table 212 can be populated with data that can be selected by a decoder (not shown) that can receive a signal(s) from multiplexor 204, such as those corresponding to a 10-digit binary number, that represents a difference in magnitude between the reference current at the highest specified operating temperature for the memory device and the current at the lowest operating temperature for the memory device to select the appropriate row(s) of the ROM table 212. Another decoder (not shown) can also receive a signal(s) from temperature sensor 210, such as those corresponding to a 7-digit binary number, that represents the sensed operating temperature of the memory device and selects the appropriate columns of the ROM table 212. ROM table 212 can output a signal(s) corresponding to a 10-digit binary number to adder 214.

The ROM table 212 output can be sent to adder 214 along with the output of multiplexor 208, a signal(s) corresponding to a 10-digit binary number that represents a magnitude of the reference current at the lowest specified operating temperature. The adder 214 can output a signal(s) corresponding to a 10-digit binary number (e.g., 10 signals, RefCur<9:0>) corresponding to an interpolated magnitude of the reference current at the sensed operating temperature of the memory device. The output of adder 214 can be sent to current mirror legs 216. The output of the adder 214 can be mirrored with a bandgap current to produce a reference current for sensing the state of a memory cell. The produced reference current can be sent from the current mirror legs 216 to be mirrored to a number of locations on the memory device and then to sensing circuitry, e.g., a comparator, where the produced reference current can be compared to the output of the memory cell.

Embodiments are not limited to the particular implementations described herein. For example, the resolution of the ROM can be increased or decreased to suit the parameters of a particular implementation, and accordingly, input signals corresponding to greater or fewer than 7-digit or 10-digit binary numbers can be used. Furthermore, embodiments of the present disclosure are not limited to implementations using binary numbers or a particular amount of data associated with various signals.

Figure 3:
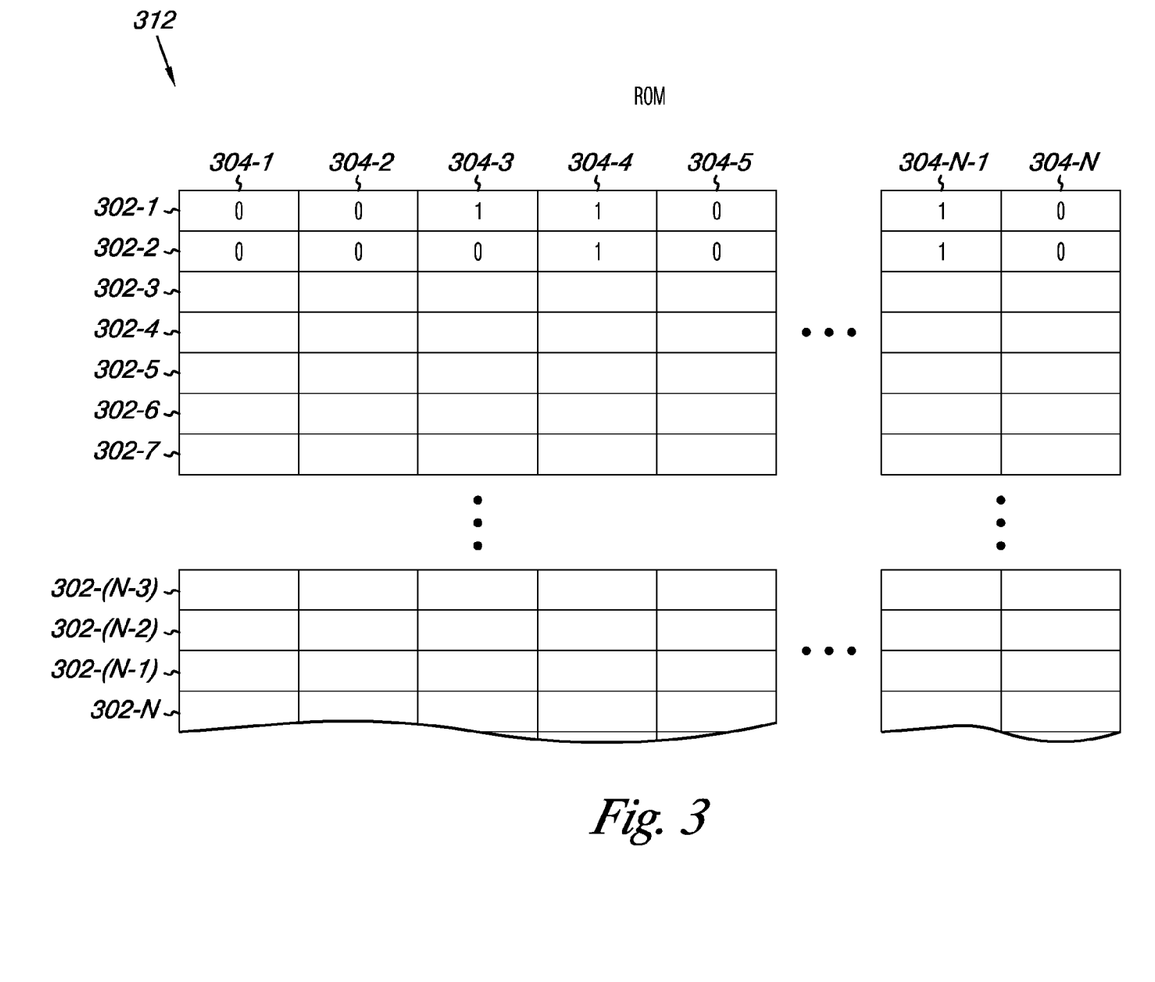
FIG. 3 is a look-up table of data corresponding to desired changes in currents for use with a multilevel phase change memory cells in accordance with one or more embodiments of the present disclosure.

FIG. 3 is a look-up table of data corresponding to desired changes in reference currents for use with a multilevel phase change memory device in accordance with one or more embodiments of the present disclosure. In FIG. 3, the look-up table, e.g., ROM 312, consists of a number of columns 304-1, 304-2, 304-3, 304-4, 304-5, 304-N-1, and 304-N. The columns in ROM 312 correspond to the temperature of the memory device. The ROM 312 receives a signal(s) corresponding to a 7-digit binary number from a temperature sensor corresponding to the operating temperature of the memory device. The signal is decoded and the columns associated with the device's temperature are selected in the ROM 312. In one or more embodiments, the ROM 312 can have 810 columns. The columns corresponds to 81 temperatures that occur in 2 degree Celsius (° C.) increments in a memory device operating range of −40° C. to 120° C. and for each temperature increment there are 10 columns that correlate to the 10-digit binary number corresponding to a desired change in current.

ROM 312 also includes a number of rows 302-1, 302-2, 302-3, 302-4, 302-5, 302-6, 302-7, 302-N-3, 302-N-2, 302-N-1, and 302-N. The ROM 312 receives a signal(s) corresponding to a 10-digit number from a multiplexor that corresponds to a difference in reference current magnitudes at a certain high and a certain low specified operating temperatures. The signal(s) is decoded and the rows associated with the difference are selected in the ROM 312. The ROM 312 generates a signal(s) corresponding to a multiplication factor, e.g., a 10-digit binary number, from its look-up table corresponding to a difference in reference current magnitudes at the certain high and low specified operating temperatures. In one or more embodiments, ROM 312 can have 1024 rows. The rows 302-1, 302-2, . . . 302-N correspond to a number of 10-digit binary number combinations that are associated with the difference input to the ROM 312.

In one or more embodiments, ROM 312 can be implemented as a single transistor pulldown with a metal or contact programmable data value. In one or more embodiments, a single bit of the ROM 312 is approximately 0.16 µm², therefore in an embodiment with 810 columns and 1024 row would have a footprint of $1.32 \times 10^5$ µm². For certain memory devices, this footprint may constitute less than 8% of the available space in the periphery of the device.

The ROM 312 can be placed in an area on a side of a die. The ROM 312 can also be physically segmented to allow for portions of the ROM 312 to be placed in various areas of the die. The ROM 312 can operate without DC currents and can also be read whenever the temperature sensor changes its output.

In two-bit multi-level cells, at least five reference currents can be used, therefore a number of fuses corresponding to the different reference currents can be coupled to the ROM 312. The ROM 312 can output a temperature dependent change in current in a linear or non-linear curve fit.

Figure 4:
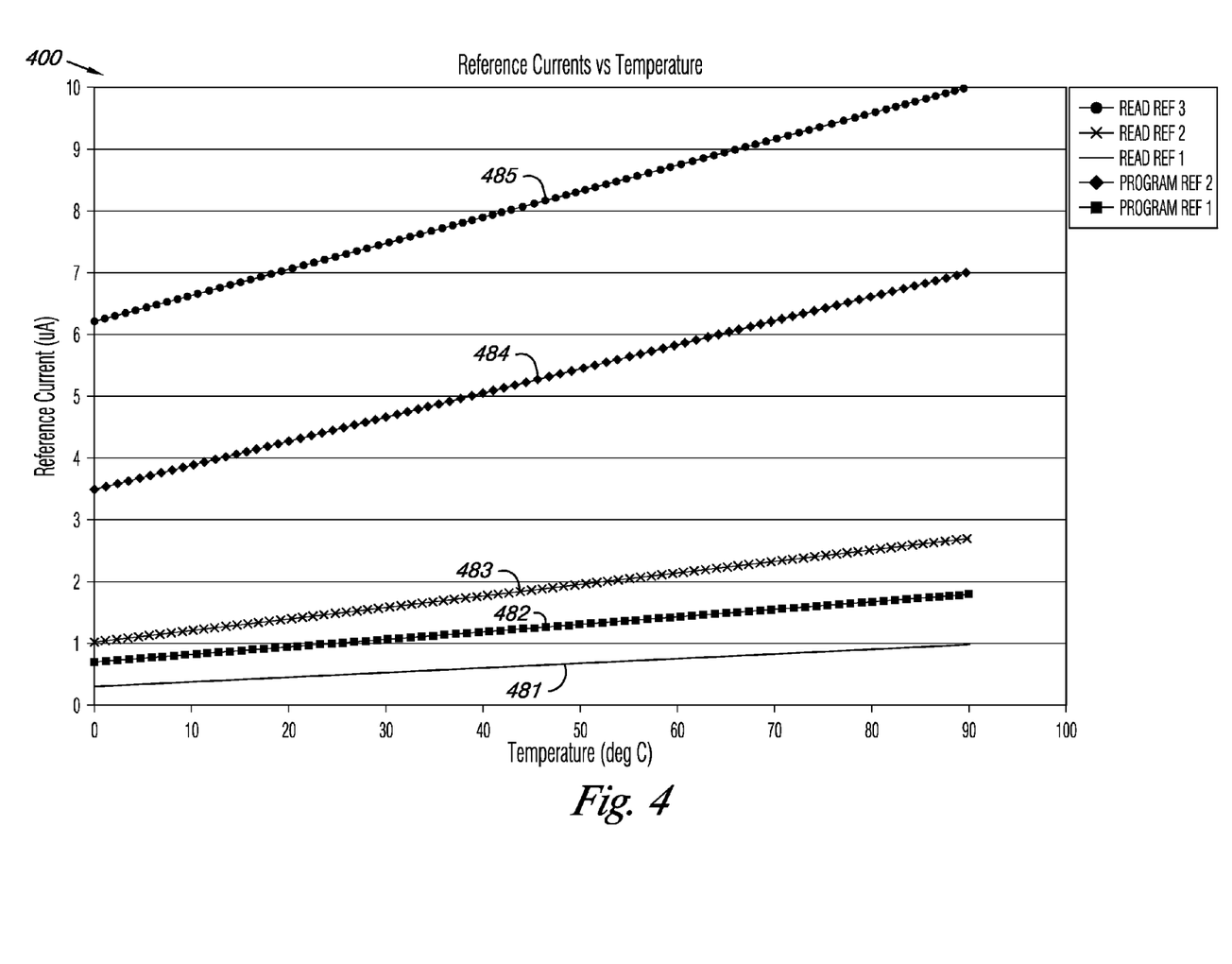
FIG. 4 is a graph of five temperature compensated reference currents versus temperature that can be generated in accordance with one or more embodiments of the present disclosure.

FIG. 4 is a graph 400 of five temperature compensated reference currents 481, 482, 483, 484, and 485 versus temperature that can be generated in accordance with one or more embodiments of the present disclosure. Reference currents 481, 482, 483, 484, and 485 versus temperature, e.g., "curves," can be determined experimentally by applying a number of known, bandgap currents to the phase change material of a phase change memory cell at a number of temperatures, and measuring the reference currents associated with the memory cell for each temperature. In one or more embodiments, the temperature compensated reference currents can be provided as described in Taylor.

Each point on the reference current curves can represent a current magnitude, e.g., value, which can be used as a temperature compensated initial current in accordance with one or more embodiments discussed in Taylor. That is, the current magnitudes illustrated by the reference current curves for a given temperature can represent the temperature compensated initial currents for that temperature.

In one or more embodiments reference current curve 481 can correspond to Read Ref 1, reference current curve 482 can correspond to Program Ref 1, reference current curve 483 can correspond to Read Ref 2, reference current curve 484 can correspond to Program Ref 2, and reference current curve 485 can correspond to Read Ref 3. As the reader will appreciate, "Read Ref" can indicate a sensing current used for a read operation and "Program Ref" can indicate a sensing current used for a program verify operation.

Each point on the reference current curves can represent a current magnitude, e.g., value, which can be used as a temperature compensated reference current in accordance with one or more embodiments of the present disclosure. That is, the current magnitudes illustrated by the reference current curves for a given temperature can represent the temperature compensated reference currents for that temperature. For example, as shown in FIG. 4, to achieve temperature compensation of the reference currents at a temperature of 30 degrees Celsius, Read Ref 1 can be 0.4 uA, Program Ref 1 can be 1.0 uA, Read Ref 2 can be 1.6 uA, Program Ref 2 can be 4.5 uA, and Read Ref 3 can be 7.4 uA. Similarly, to achieve temperature compensation at a temperature of 60 degrees Celsius, Read Ref 1 can be 0.7 uA, Program Ref 1 can be 1.5 uA, Read Ref 2 can be 2.2 uA, Program Ref 2 can be 5.5 uA, and Read Ref 3 can be 8.8 uA.

Embodiments of the present disclosure are not limited to the reference current curves shown in FIG. 4. Rather, embodiments of the present disclosure can include different numbers of reference currents, including different numbers of read reference current curves and/or program reference current curves, which can illustrate temperature compensated reference currents in accordance with one or more embodiments of the present disclosure.

Figure 5:
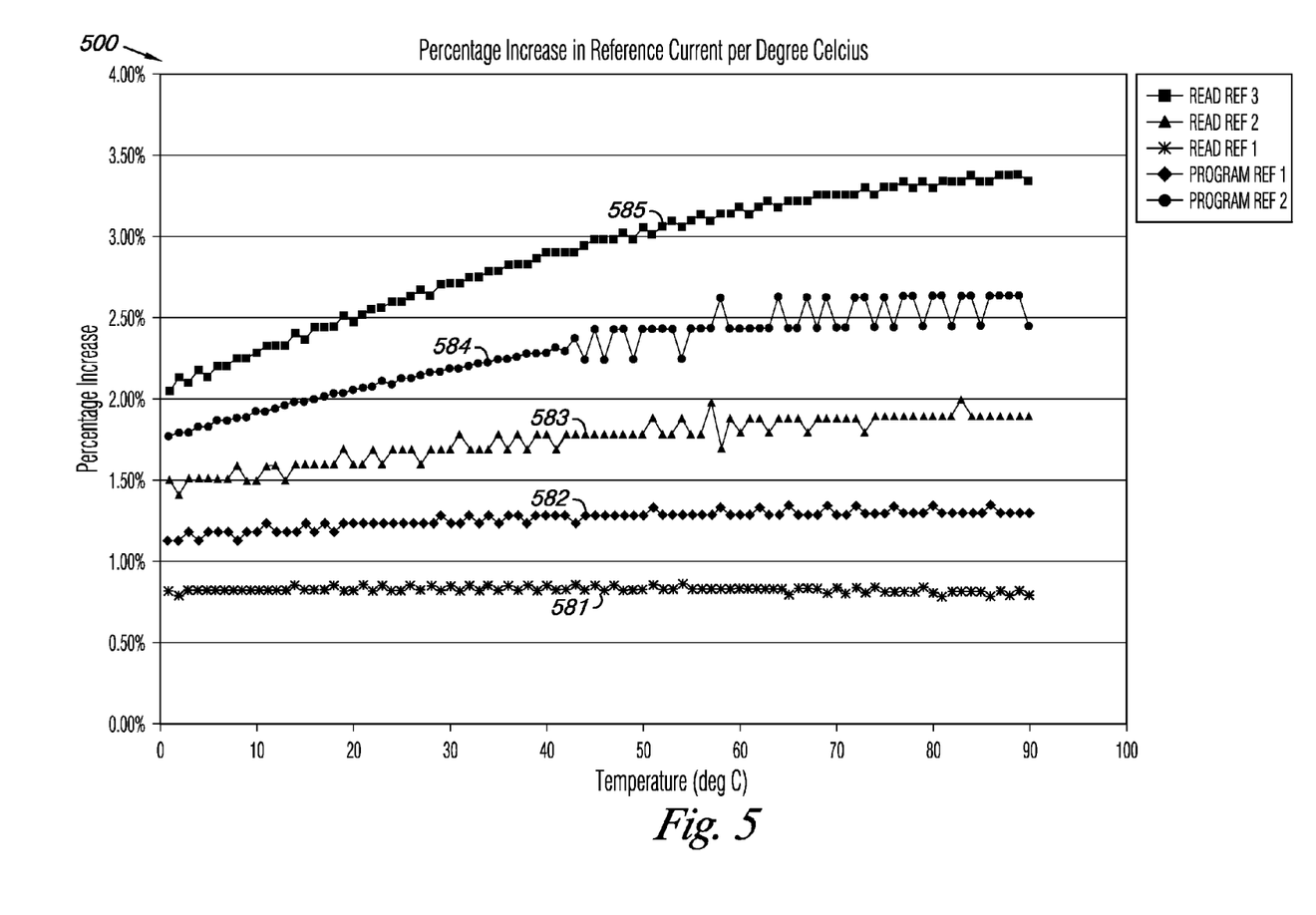
FIG. 5 is a graph of the percentage increase in the five temperature compensated reference currents of FIG. 4 versus temperature in accordance with one or more embodiments of the present disclosure.

FIG. 5 is a graph of the percentage increase in the five temperature compensated reference currents of FIG. 4 versus temperature in accordance with one or more embodiments of the present disclosure.

The percentage increase for Read Ref 1 581 is constant through the temperature change on the graph at approximately 0.80%, indicating that the Read Ref 1 current change due to temperature changes is linear on a log scale. This pattern is followed for Program Ref 1, which as a percentage increase of approximately 1.1-1.2% over the temperature range of the graph.

The percentage increase for Read Ref 2 583, Program Ref 2 584, and Read Ref 3 585 all increase as the temperature increases. This indicates a non-linear current change (on a log scale) with respect to temperature change for these reference currents. The linear and non-linear relationships between the reference current and the temperature of the memory device are interpolated from the data stored in the look-up table, e.g., ROM. The current at the lowest specified operating temperature and the highest specified operating temperature is embedded in the fuses for each reference current. These values embedded in the fuses are input into the ROM to facilitate interpolation of a temperature compensated reference current for a given reference current based on a temperature input.

Figure 6:
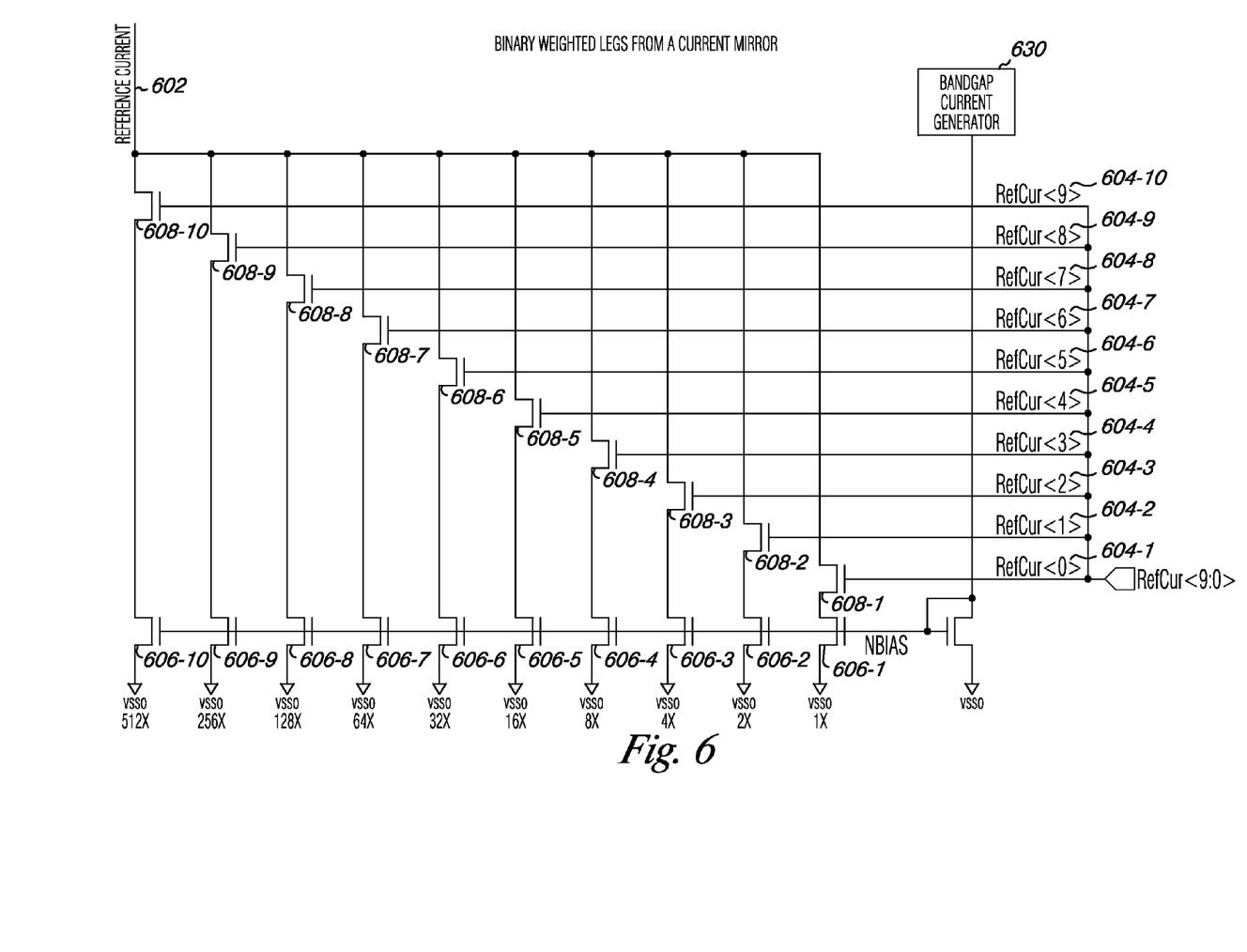
FIG. 6 illustrates circuitry for producing one or more reference currents using binary weighted legs in accordance with one or more embodiments of the present disclosure.

FIG. 6 illustrates circuitry for producing one or more reference currents using binary weighted legs from a current mirror in accordance with one or more embodiments of the present disclosure.

In FIG. 6, a band gap current generator 630 generates a temperature independent current that is input to a series of mirroring transistors 606-1, 606-2, 606-3, 606-4, 606-5, 606-6, 606-6, 606-8, 606-9, and 606-10. The signal(s) (e.g., 10 signals, RefCur<9.0>) corresponding to an interpolated magnitude of the selected desired reference current at the operating temperature is fed into the current mirror via the 10 inputs 604-1, 604-2, 604-3, 604-4, 604-5, 604-6, 604-7, 604-8, 604-9, and 604-10. These signals can open or close the gates on transistors 608-1, 608-2, 608-3, 608-4, 608-5, 608-6, 608-7, 608-8, 608-9, and 608-10. When a transistor 608-1, 608-2, 608-3, 608-4, 608-5, 608-6, 608-7, 608-8, 608-9, or 608-10 is turned on by a respective signal on an input 604-1, 604-2, 604-3, 604-4, 604-5, 604-6, 604-7, 604-8, 604-9, or 604-10, the band gap current is mirrored by a multiplication factor associated with the transistor. This allows the band gap current to be multiplied by the appropriate factor to compensate for temperature changes in the memory device. The temperature compensated reference current 602 is output from the current mirror and can be sent to various locations on the memory device and can be used in sensing circuitry, e.g., a comparator, for sensing the state of a memory cell.

Figure 7:
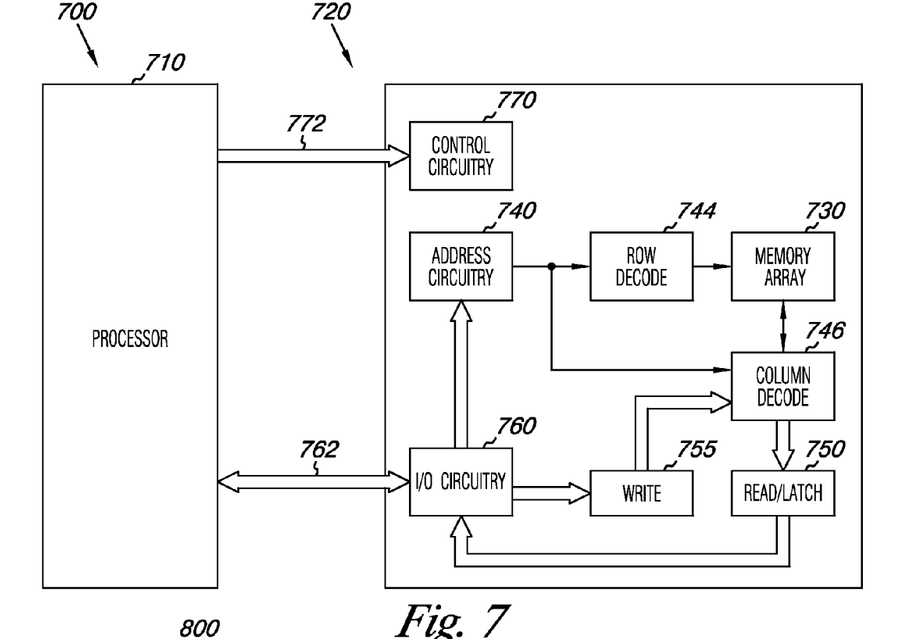
FIG. 7 is a functional block diagram of an electronic memory system having at least one memory device in accordance with one or more embodiments of the present disclosure.

FIG. 7 is a functional block diagram of an electronic memory system 700 having at least one memory device 720 in accordance with one or more embodiments of the present disclosure. Memory system 700 can include a processor 710 coupled to a memory device 720 that can include a memory array 730 of memory cells, e.g., memory array 100 shown in FIG. 1. The memory system 700 can include separate integrated circuits or both the processor 710 and the memory device 720 can be on the same integrated circuit. The processor 710 can be a microprocessor or some other type of controlling circuitry such as an application-specific integrated circuit (ASIC).

The memory device 720 can include an array of memory cells 730, which can be resistance variable memory cells with a PCRAM architecture, for example. The embodiment of FIG. 7 includes address circuitry 740 to latch address signals provided over I/O connections 762 through I/O circuitry 760. Address signals can be received and decoded by a row decoder 744 and a column decoder 746 to access the memory array 730. It will be appreciated by those skilled in the art that the number of address input connections can depend on the density and architecture of the memory array 730 and that the number of addresses can increase with both increased numbers of memory cells and increased numbers of memory blocks and arrays.

The memory array 730 can include multilevel memory cells having different numbers of programmed states, sensing references, etc., according to embodiments described herein. The read/latch circuitry 750 can read and latch a page or row of data from the memory array 730. I/O circuitry 760 can be included for bi-directional data communication over the I/O connections 762 with the processor 710. Write circuitry 755 can be included to write data to the memory array 730.

Control circuitry 770 can decode signals provided by control connections 772 from the processor 710. These signals can include chip signals, write enable signals, and address latch signals that are used to control the operations on the memory array 730, including data sensing, data write, and data erase operations. In one or more embodiments, the control circuitry 770 can be responsible for executing instructions from the processor 710 to perform the operations according to embodiments of the present disclosure. The control circuitry 770 can be a state machine, a sequencer, or some other type of controller. It will be appreciated by those skilled in the art that additional circuitry and control signals can be provided, and that the memory device detail of FIG. 7 has been reduced to facilitate ease of illustration.

Figure 8:
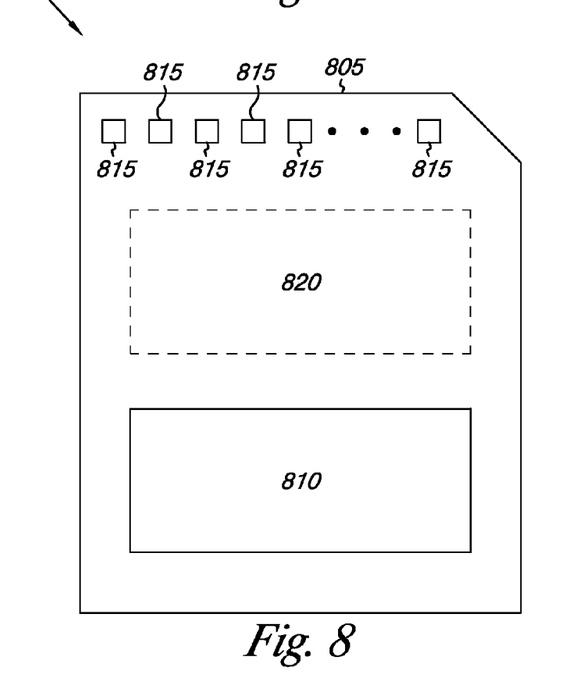
FIG. 8 is a functional block diagram of a memory module having at least one memory device in accordance with one or more embodiments of the present disclosure.

FIG. 8 is a functional block diagram of a memory module 800 having at least one memory device 810 in accordance with one or more embodiments of the present disclosure. Memory module 800 is illustrated as a memory card, although the concepts discussed with reference to memory module 800 are applicable to other types of removable or portable memory (e.g., USB interface drives) and are intended to be within the scope of "memory module" as used herein. In addition, although one example form factor is depicted in FIG. 8, these concepts are applicable to other form factors as well.

In one or more embodiments, memory module 800 can include a housing 805 (as depicted) to enclose one or more memory devices 810, though such a housing is not essential to all devices or device applications. At least one memory device 810 can include an array of multilevel memory cells that can be sensed according to embodiments described herein. Where present, the housing 805 includes one or more contacts 815 for communication with a host device. Examples of host devices include digital cameras, digital recording and playback devices, PDAs, personal computers, memory card readers, interface hubs and the like. For one or more embodiments, the contacts 815 are in the form of a standardized interface. For example, with a USB interface drive, the contacts 815 might be in the form of a USB Type-A male connector. In general, contacts 815 can provide an interface for passing control, address and/or data signals between the memory module 800 and a host having compatible receptors for the contacts 815.

The memory module 800 may optionally include additional circuitry 820, which may be one or more integrated circuits and/or discrete components. For one or more embodiments, the additional circuitry 820 may include control circuitry, such as a memory controller, for controlling access across multiple memory devices 810 and/or for providing a translation layer between an external host and a memory device 810. For example, there may not be a one-to-one correspondence between the number of contacts 815 and a number of 810 connections to the one or more memory devices 810. Thus, a memory controller could selectively couple an I/O connection (not shown in FIG. 8) of a memory device 810 to receive the appropriate signal at the appropriate I/O connection at the appropriate time or to provide the appropriate signal at the appropriate contact 815 at the appropriate time. Similarly, the communication protocol between a host and the memory module 800 may be different than what is required for access of a memory device 810. A memory controller could then translate the command sequences received from a host into the appropriate command sequences to achieve the desired access to the memory device 810. Such translation may further include changes in signal voltage levels in addition to command sequences.

The additional circuitry 820 may further include functionality unrelated to control of a memory device 810 such as logic functions as might be performed by an ASIC. Also, the additional circuitry 820 may include circuitry to restrict read or write access to the memory module 800, such as password protection, biometrics or the like. The additional circuitry 820 may include circuitry to indicate a status of the memory module 800. For example, the additional circuitry 820 may include functionality to determine whether power is being supplied to the memory module 800 and whether the memory module 800 is currently being accessed, and to display an indication of its status, such as a solid light while powered and a flashing light while being accessed. The additional circuitry 820 may further include passive devices, such as decoupling capacitors to help regulate power requirements within the memory module 800.

CONCLUSION

Devices, methods, and systems for temperature compensation in memory devices, such as resistance variable memory, among other types of memory, have been described herein. One or more embodiments can include a memory device including a table with an output that is used to create a multiplication factor for a current to compensate for temperature changes in the memory device, where the output depends on an operating temperature of the memory device and a difference in the current between a highest specified operating temperature and a lowest specified operating temperature of the memory device.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A memory device, comprising:
   circuitry including one or more groups of sets of fuses to generate a reference current; and
   a table with an output that is used to create a multiplication factor applied to a current to change the magnitude of the current and to compensate for temperature changes in the memory device, where the output depends on an operating temperature of the memory device and a difference in the current between a highest specified operating temperature and a lowest specified operating temperature of the memory device.

2. The device of claim 1, wherein the operating temperature of the memory device is input to the table to at least partially select the output from a number of possible outputs.

3. The device of claim 1, where the output is supplied to one of an adder and a subtractor that outputs the multiplication factor.

4. The device of claim 1, wherein the multiplication factor is input to a binary weighted current mirror that is supplied with and multiplies a bandgap current.

5. The device of claim 1, wherein the table is a read only memory (ROM) that is placed in an area on a side of a die and is physically segmented to allow for portions of the ROM to be placed in various portions of the area of the die.

6. A memory device, comprising:
   a number of memory cells, wherein at least one memory cell is a phase change random access memory (PCRAM) cell;
   circuitry including one or more groups of sets of fuses to generate a reference current and mirror the current to a number of locations on the memory device; and
   a table, wherein the table is used to interpolate an output that is part of a multiplication factor to compensate the reference current for temperature changes in the memory device.

7. The device of claim 6, wherein the PCRAM cell includes a Germanium-Antimony-Tellurium (GST) material.

8. The device of claim 6, wherein the table stores data corresponding to a number of reference currents at a number of temperatures.

9. A memory device, comprising:
   a first group of sets of fuses, where each set of fuses has an output corresponding to a respective one of a plurality of reference currents at one of a lowest specified operating temperature and a highest specified operating temperature of the memory device;
   a second group of sets of fuses, where each set of fuses of the second group has an output corresponding to a difference in magnitude between a respective one of the reference currents at the lowest specified operating temperature and at the highest specified operating temperature of the memory device;
   a temperature sensor, where the temperature sensor has an output corresponding to an operating temperature of the memory device;
   a table populated with data that corresponds to changes in magnitude of the reference currents at various temperatures, where the table output corresponds to a change in magnitude from a selected one of the reference currents at the one of the lowest specified operating temperature and the highest specified operating temperature to the selected one of the reference currents at the operating temperature based on the output from the second group of sets of fuses and the output of the temperature sensor; and one of an adder and a subtractor, where the output of the table and the output of the first group of sets of fuses are one of added or subtracted to produce a signal corresponding to a magnitude of the selected one of the reference currents at the operating temperature, wherein the signal corresponding to the magnitude of the selected one of the reference currents at the operating temperature is used to produce a reference current having the magnitude and that is used in sensing a state of a memory cell.

10. The device of claim 9, including a multiplexor configured to selected one of the sets of fuses from the first group.

11. The device of claim 9, including a multiplexor configured to select one of the sets of fuses from the second group.

12. The device of claim 9, wherein the table comprises a number of single transistor pulldowns.

13. The device of claim 9, wherein the sets of fuses are fuses of a different type than the memory cell.

14. A method for producing a temperature compensated current, comprising:
interpolating a magnitude of the temperature compensated current between the temperature compensated current at a certain low operating temperature and a certain high operating temperature of a memory device using a temperature sensor, a look-up table, and one or more groups of sets of fuses; and
producing the temperature compensated current based on the interpolation.

15. The method of claim 14, wherein interpolating the magnitude of the temperature compensated current includes providing a first signal representing the magnitude of the temperature compensated current at a certain low operating temperature of the memory device from a set of fuses in a first group of fuses.

16. The method of claim 15, wherein interpolating the magnitude of the temperature compensated current includes providing a second signal representing a difference in magnitude of the temperature compensated current between a certain high operating temperature and a certain low operating temperature of the memory device from a set of fuses in a second group of fuses.

17. The method of claim 14, wherein interpolating the magnitude of the temperature compensated current includes selecting at least one of a number of possible values of a product corresponding to a function for interpolating magnitudes of the temperature compensated current in the look-up table.

18. The method of claim 14, including:
outputting from the temperature sensor a signal corresponding to an operating temperature of the memory device to a first decoder;
outputting from at least one of the groups of sets of fuses a signal corresponding to the difference in magnitude of the temperature compensated current at the certain high operating temperature and at the certain low operating temperature to a second decoder; and
using the first and the second decoders to select a product from the look-up table.

19. The method of claim 14, including:
outputting a signal from the look-up table to an adder;
outputting from at least one of the groups of sets of fuses a signal corresponding to the magnitude of the temperature compensated current at the certain low operating temperature to the adder;

outputting a signal from the adder based on the sum of the signal from the look-up table and the signal corresponding to the magnitude of the temperature compensated current at the certain low operating temperature; and
producing the temperature compensated current by sending the signal from the adder to binary weighted leg circuitry that generates the temperature compensated current.

20. The method of claim 19, including outputting the temperature compensated current to mirroring circuitry, where the temperature compensated current is mirrored to a number of locations on the memory device.

21. The method of claim 14, including generating one or more temperature compensated currents using the temperature sensor, the look-up table, and the groups of sets of fuses.

22. A method for producing a reference current used in sensing a variable resistance memory cell comprising:
sensing an operating temperature;
determining a desired change in magnitude from the reference current at a particular temperature to the reference current at the operating temperature based at least partially on the sensed operating temperature;
providing a signal based on the desired change in magnitude and the reference current at the particular temperature; and
producing the reference current at the operating temperature based on the signal.

23. The method of claim 22, wherein determining the desired change in magnitude comprises looking up the desired change in magnitude in a look-up table based on a signal corresponding to the sensed operating temperature and a signal corresponding to a difference in magnitude between the reference current at a certain low operating temperature and the reference current at a certain high operating temperature.

24. The method of claim 23, further comprising selecting the signal corresponding to the difference in magnitude between the reference current at the certain low operating temperature and the reference current at the certain high operating temperature from a plurality of signals.

25. The method of claim 24, wherein each of the plurality of signals corresponds to a different reference current.

26. The method of claim 22, wherein providing the signal based on the desired change in magnitude and the reference current at the particular temperature comprises adding a signal corresponding to the desired change in magnitude to a signal corresponding to the reference current at the particular temperature.

27. The method of claim 22, wherein producing the reference current comprises multiplying a band gap current by a factor in accordance with the signal.

28. The method of claim 27, wherein the signal causes at least one transistor to turn on or off and wherein the factor is associated with transistors that are turned on.

29. The method of claim 22, wherein the reference current at the particular temperature comprises the reference current at a lowest specified operating temperature of a device including the cell; and
wherein the method further comprises outputting a signal corresponding to the reference current at the lowest specified operating temperature based on a selected set of programmed fuses, wherein each of a plurality of sets of fuses corresponds to a different reference current.

* * * * *